(12) United States Patent
Kwon

(10) Patent No.: US 12,538,661 B2
(45) Date of Patent: Jan. 27, 2026

(54) ELECTROLUMINESCENCE DISPLAY

(71) Applicant: LG DISPLAY CO., LTD., Seoul (KR)

(72) Inventor: Ohnam Kwon, Paju-si (KR)

(73) Assignee: LG Display Co., Ltd (KR)

( * ) Notice: Subject to any disclaimer, the term of this patent is extended or adjusted under 35 U.S.C. 154(b) by 579 days.

(21) Appl. No.: 17/976,774

(22) Filed: Oct. 29, 2022

(65) Prior Publication Data

US 2023/0209905 A1 Jun. 29, 2023

(30) Foreign Application Priority Data

Dec. 29, 2021 (KR) ........................ 10-2021-0191097

(51) Int. Cl.
*H10K 59/122* (2023.01)
*H10K 50/81* (2023.01)
(Continued)

(52) U.S. Cl.
CPC ........... *H10K 59/122* (2023.02); *H10K 50/81* (2023.02); *H10K 50/82* (2023.02); *H10K 59/131* (2023.02);
(Continued)

(58) Field of Classification Search
CPC ............................... H10K 50/81; H10K 50/82
(Continued)

(56) References Cited

U.S. PATENT DOCUMENTS

| | | | |
|---|---|---|---|
| 2004/0256980 A1* | 12/2004 | Tsuchiya ................. | H10K 71/60 313/506 |
| 2006/0226530 A1* | 10/2006 | Dinter .................... | H10D 84/907 257/691 |

(Continued)

FOREIGN PATENT DOCUMENTS

| | | |
|---|---|---|
| KR | 20150041509 A | 4/2015 |
| KR | 20210038182 A | 4/2021 |

OTHER PUBLICATIONS

Xie Zhi-yuan, "Reduced ambient reflection of organic light-emitting diodes by utilizing multilayer low-reflection cathodes", 2006, Institute of Physics Publishing, Semiconductor Science and Technology, 21 (2006), pp. 1077-1082 (Year: 2006).*

(Continued)

*Primary Examiner* — Bumsuk Won
(74) *Attorney, Agent, or Firm* — Fish & Richardson P.C.

(57) ABSTRACT

An electroluminescence display includes a substrate including a display area and a non-display area, the non-display area disposed around the display area; a low potential pad disposed at the non-display area, and including a first electrode layer and a second electrode layer on the first electrode layer; a bank including a cathode contact hole exposing a middle portion of the low potential pad, and covering edge portions of the low potential pad; a mushroom structure element disposed at the middle portion of the low potential pad; an under-cut area formed at under edges of the bank and the mushroom structure element; a first cathode layer deposited on an upper surface of the bank and the mushroom structure element, an upper surface of the low potential pad exposed by the cathode contact hole and the under-cut area; a second cathode layer deposited on the first cathode layer excepting the under-cut area; and a third cathode layer contacting an upper surface of the second cathode layer, and the first cathode layer at the under-cut area.

14 Claims, 6 Drawing Sheets

(51) Int. Cl.
  *H10K 50/82*    (2023.01)
  *H10K 59/131*   (2023.01)
  *H10K 102/00*   (2023.01)
  *H10K 102/10*   (2023.01)

(52) U.S. Cl.
  CPC . *H10K 2102/102* (2023.02); *H10K 2102/103* (2023.02); *H10K 2102/351* (2023.02)

(58) Field of Classification Search
  USPC .......................................................... 257/40
  See application file for complete search history.

(56) References Cited

U.S. PATENT DOCUMENTS

| | | | | |
|---|---|---|---|---|
| 2015/0357388 | A1* | 12/2015 | Pang | H10K 59/123 |
| | | | | 438/23 |
| 2016/0133880 | A1* | 5/2016 | Lee | H10K 50/858 |
| | | | | 257/40 |
| 2021/0408441 | A1* | 12/2021 | Lee | H10K 50/814 |
| 2023/0413618 | A1* | 12/2023 | Fang | H10K 59/126 |

OTHER PUBLICATIONS

Kido Junji, "Bright organic electroluminescent devices having a metal-doped electron-injecting layer", Nov. 16, 1998, Applied Physics Letters, vol. 73, No. 20, pp. 2866-2868 (Year: 1998).*

* cited by examiner

ELECTROLUMINESCENCE DISPLAY

CROSS-REFERENCE TO RELATED APPLICATION

This application claims the priority of Korean Patent Application No. 10-2021-0191097 filed on Dec. 29, 2021, which is hereby incorporated by reference in its entirety.

BACKGROUND

Field of the Disclosure

The present disclosure relates to an electroluminescence display having a low reflective cathode electrode. In particular, the present disclosure relates to an electroluminescence display having a connection structure for reducing the contact resistance in connection between a low-potential pad applying a low-potential voltage and a low reflective cathode electrode.

Description of the Background

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In the electroluminescence display, to prevent the degradation of the display quality due to reflection of external light, it is required to apply a low-reflection structure to the cathode electrode. In addition, in applying the low-reflection structure, there is a need for structural improvement so that a voltage increase does not occur in the low-potential voltage applied to the cathode electrode. In particular, there is a need for a connection structure for lowering contact resistance at a connection portion between a cathode electrode having a low reflection structure and a low-potential pad applying a low potential voltage.

SUMMARY

Accordingly, the present disclosure, as for solving the problems described above, is to provide an electroluminescence display having a low reflection cathode electrode capable of reducing display quality deterioration due to the reflection of the external light by the cathode electrode.

The present disclosure is also to provide an electroluminescence display having a structure for lowering a connecting resistance between a cathode electrode and a low potential pad in a low potential pad portion for applying a low potential voltage to a cathode electrode having a low reflection structure.

In order to accomplish the above mentioned features of the present disclosure, an electroluminescence display according to the present disclosure includes a substrate including a display area and a non-display area, the non-display area disposed around the display area; a low potential pad disposed at the non-display area, and including a first electrode layer and a second electrode layer on the first electrode layer; a bank including a cathode contact hole exposing a middle portion of the low potential pad, and covering edge portions of the low potential pad; a mushroom structure element disposed at the middle portion of the low potential pad; an under-cut area formed at under edges of the bank and the mushroom structure element; a first cathode layer deposited on an upper surface of the bank and the mushroom structure element, an upper surface of the low potential pad exposed by the cathode contact hole and in the under-cut area; a second cathode layer deposited on the first cathode layer excepting the under-cut area; and a third cathode layer contacting an upper surface of the second cathode layer, and the first cathode layer at the under-cut area.

In an example aspect, the first electrode layer includes a transparent conductive material. The second electrode layer includes a metal material having a low resistance.

In an example aspect, the transparent conductive material includes at least one of indium-tin-oxide and indium-zinc-oxide. The metal material includes one of aluminum (Al), copper (Cu), molybdenum (Mo), chromium (Cr), titanium (Ti) and tantalum (Ta).

In an example aspect, the first cathode layer has a first thickness in range of 100 Å to 200 Å. The second cathode layer has a second thickness in range of 500 Å to 900 Å. The third cathode layer has a third thickness in range of 2,000 Å to 3,000 Å.

In an example aspect, the first cathode layer directly contacts a side wall of the second electrode layer over-etched at the under-cut area. The third cathode layer directly contacts the first cathode layer and the side wall of the over-etched second electrode layer, at the under-cut area.

In an example aspect, a plurality of the mushroom structure elements is arrayed on the low potential pad exposed to the cathode contact hole.

In an example aspect, the electroluminescence display further comprises: a pixel disposed in the display area. The pixel includes: an anode electrode on the substrate; a bank covering edges of the anode electrode, and exposing middle portions of the anode electrode; an emission layer on the bank and the anode electrode exposed to the bank; and a cathode electrode having a first cathode layer on the emission layer, a second cathode layer on the first cathode layer, and a third cathode layer on the second cathode layer.

In an example aspect, the first cathode layer and the third cathode layer include a metal material having low surface resistance.

In an example aspect, the metal material having low surface resistance includes any one of aluminum (Al), silver (Ag), molybdenum (Mo), magnesium (Mg), calcium (Ca) and barium (Ba). The second cathode layer includes a conductive resin material.

In an example aspect, the conductive resin material includes: a domain material having one of Alq3, TmPyPB, Bphen, TAZ and TPB; and a dopant having any one of an alkali metal material and fullerene disposed in the domain material.

In an example aspect, the alkali metal material includes one of Li, Cs, $Cs_2O_3$, $CsN_3$, Rb and $Rb_2O$. The fullerene includes one of C60, C70, C76, C78, C82, C90, C94 and C96.

The electroluminescent display according to the present disclosure may have a structure in which three conductive layers are sequentially stacked on a cathode electrode. In particular, a thin metal layer is stacked at the lower layer to ensure the light transmittance, a transparent resin layer made of a conductive resin material is stacked at the middle layer and a thick metal layer with high reflectivity is stacked at the upper layer. Accordingly, the external light incident to the lower layer is partially reflected by the lower layer, and the remaining part passes through the lower layer and the transparent resin layer and then is reflected by the upper layer. Here, by adjusting the light reflected from the lower layer to have a phase opposite to that of the light reflected from the upper layer, the reflection of external light may be suppressed to 2% level or less by destructive interference. In addition, in connecting the cathode electrode having the low reflective structure and the low potential pad to which the low-potential voltage is applied, the thick metal layer which is disposed at the upper layer is directly connected to the low potential pad by the mushroom structure for ensuring the low contact resistance between them. Accordingly, the present disclosure may provide an electroluminescence display having excellent display quality by having a cathode electrode that suppresses external light reflection and maintains a constant low potential voltage.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
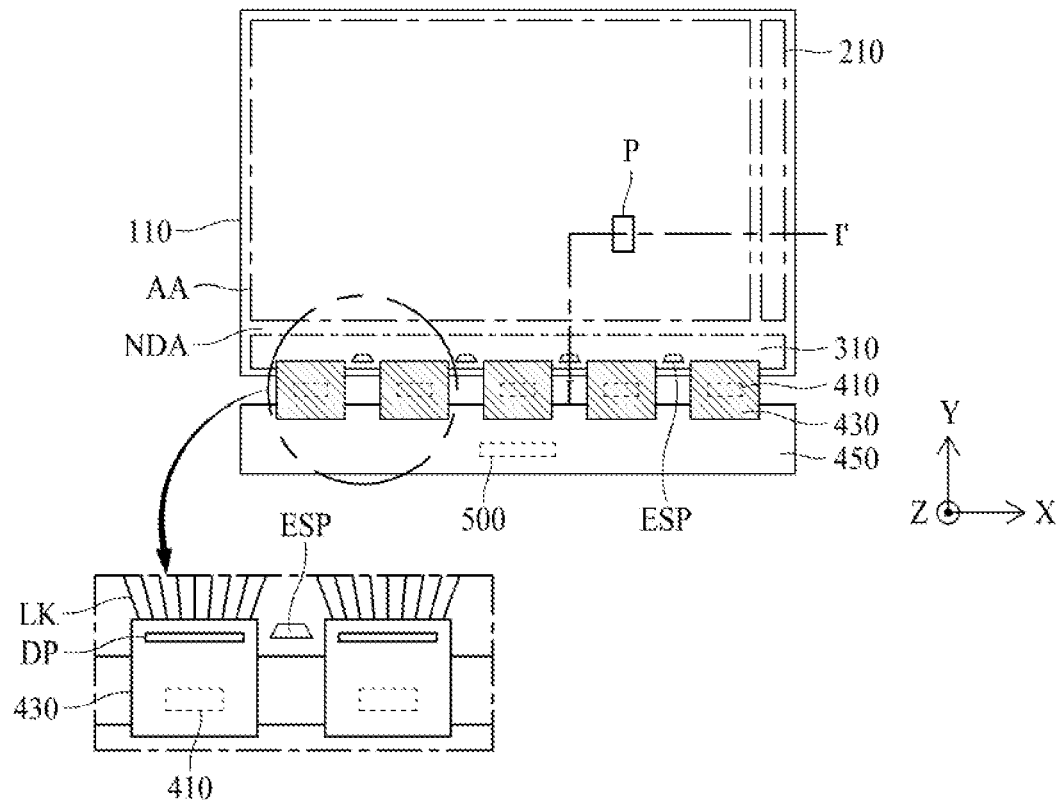
FIG. 1 is a plan view illustrating a schematic structure of an electroluminescence display according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these example aspects are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example aspects of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various aspects of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 210, a data pad portion 310, a source driving IC (Integrated Circuit) 410, a flexible circuit film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined at the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be defined at the circumference areas of the substrate 110 surrounding all or some of the display area AA. In the non-display area NDA, the gate driver 210 and the data pad portion 310 may be formed or disposed.

The gate driver 210 may supply the scan (or gate) signals to the scan lines according to the gate control signal received from the timing controller 500. The gate driver 210 may be formed at the non-display area NDA at any one outside of the display area AA on the substrate 110, as a GIP (Gate driver In Panel) type. GIP type means that the gate driver 210 is directly formed on the substrate 110.

The data pad portion 310 may supply the data signals to the data line according to the data control signal received from the timing controller 500. The data pads (not shown) disposed at one end of the data line DL may be arranged side by side at the data pad portion 310. The data pads disposed at the data pad portion 310 may be connected to the source driving integrated circuit 410. For example, the source driving IC 410 may be manufactured as a driving chip and mounted on the flexible circuit film 430. The flexible circuit film 430 may be attached at one side of the non-display area NDA of the substrate 110 in a tape automated bonding (TAB) method. The pads disposed on the flexible circuit film 430 may be connected to the data pads disposed on the data pad portion 310 in a one-to-one correspondence.

In the data pad portion 310, low potential pad ESP may be disposed between two flexible circuit films 430 adjacent each other. Each low potential pad ESP may be disposed between two adjacent groups of the data pad DP, wherein a data pad DP group is formed by gathering a plurality of data link lines LK and arranged for each group. For example, each low potential pad ESP may be disposed between two adjacent flexible circuit films 430. In the case that the plurality of link lines LK linking from the data pads DP to the data lines DL are arranged in a sector shape from the flexible circuit film 430 toward the display area AA. The low potential pad ESP may have a trapezoidal shape.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 310 to the source driving IC 410, and a plurality of second link lines connecting the data pad portion 310 to the circuit board 450. The flexible film 430 may be attached on the data pad portion 310 using an anisotropic conducting film, so that the data pad portion 310 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

First Aspect

Figure 2:
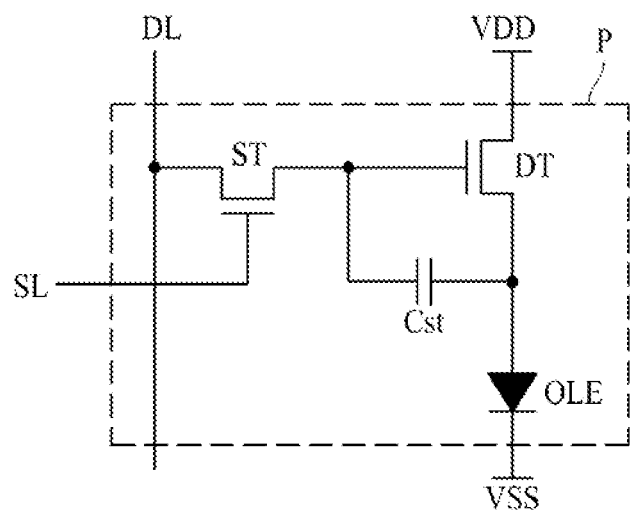
FIG. 2 is a circuit diagram illustrating a structure of one pixel included in the electroluminescence display according to the present disclosure.
Figure 3:
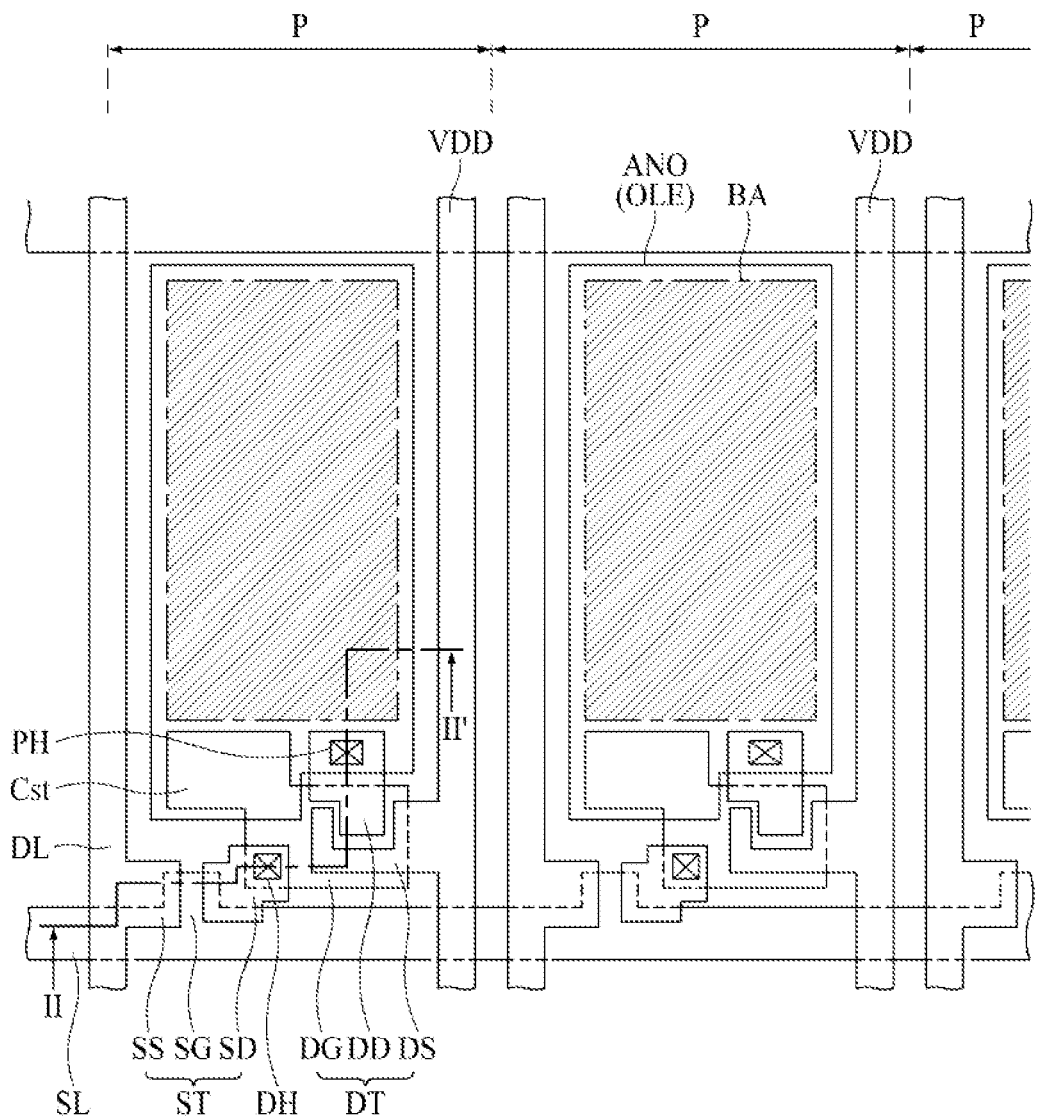
FIG. 3 is a plane view illustrating a structure of the pixels disposed in the electroluminescence display according to the present disclosure.
Figure 4:
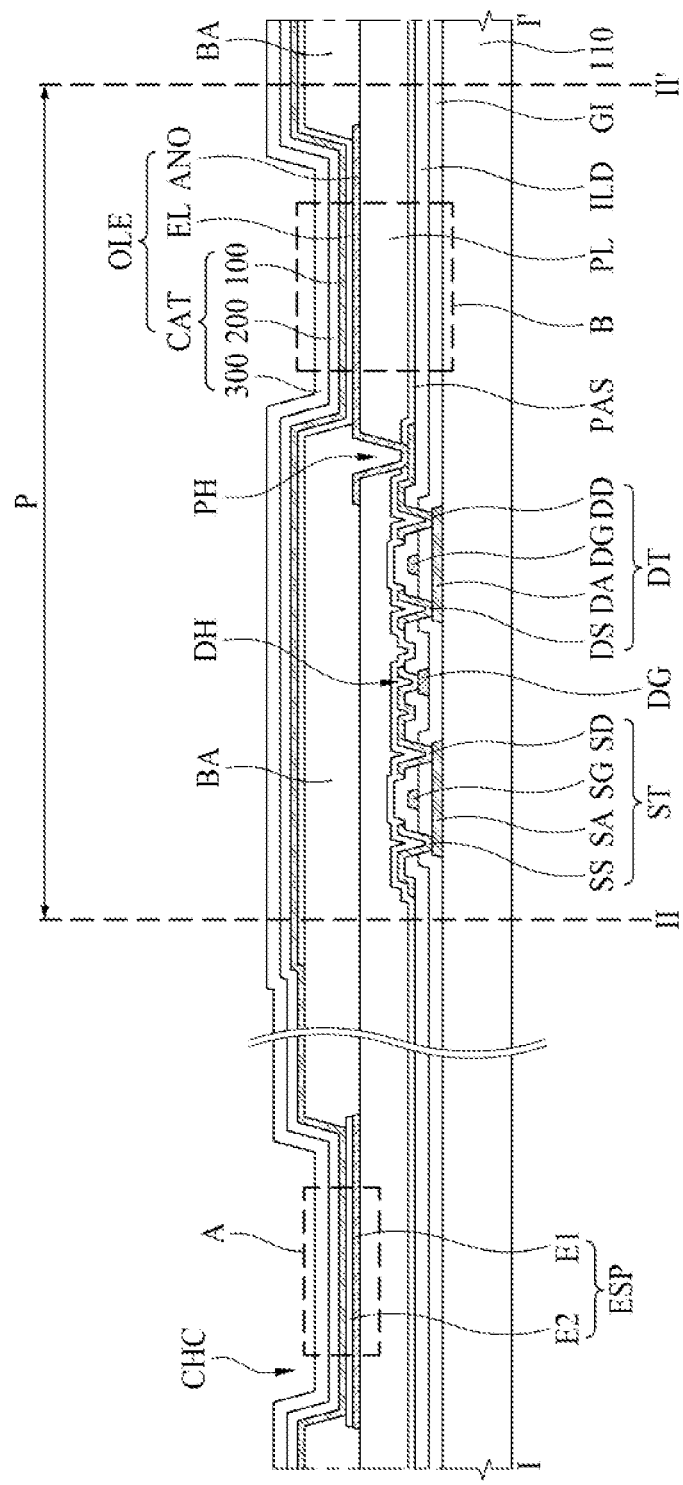
FIG. 4 is a cross-sectional view along the cutting line I-I' in FIG. 1 and the cutting II-II' in FIG. 3, for illustrating the structure of the electroluminescence display according to an aspect of the present disclosure.

Hereinafter, referring to FIGS. 2 to 4, a first aspect of the present disclosure will be explained. FIG. 2 is a circuit diagram illustrating a structure of one pixel according to the present disclosure. FIG. 3 is a plan view illustrating a structure of the pixels according to the present disclosure. FIG. 4 is a cross-sectional view along cutting line I-I' in FIG. 1 and cutting line II-II' in FIG. 3, for illustrating the structure of the electroluminescent display according to the first aspect of the present disclosure.

Referring to FIGS. 2 to 4, a plurality of pixels P are disposed in a matrix manner. Each pixel P of an electroluminescence display may be defined by a scan line SL, a data line DL and a driving current line VDD. Each pixel P of the electroluminescence display may include a switching thin film transistor ST, a driving thin film transistor DT, a light emitting diode OLE and a storage capacitor Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a switching semiconductor layer SA, a switching gate electrode SG, a switching source electrode SS and a switching drain electrode SD. The switching semiconductor layer SA may be first formed on the substrate 110. A gate insulating layer GI is deposited over the entire substrate 110 to cover the switching semiconductor layer SA. The switching gate electrode SG may be connected to the scan line SL, and overlapped with the switching semiconductor layer SA with the gate insulating layer GI there-between. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a driving semiconductor layer DA, a driving gate electrode DG, a driving source electrode DS and a driving drain electrode DD. The driving semiconductor layer DA may be first formed on the substrate 110. The gate insulating layer GI is deposited over the entire substrate 110 to cover the driving semiconductor layer DA. The driving gate electrode DG may be connected to the switching drain electrode SD of the switching thin film transistor ST, and overlapped with the driving semiconductor layer DA with the gate insulating layer GI there-between. For example, the driving gate electrode DG may be connected to the switching drain electrode SD via the drain contact hole DH penetrating the intermediate insulating layer ILD covering the driving gate electrode DG. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, an emission layer EL and a cathode electrode CAT. The light emitting diode OLE may emit the light according to the amount of the electric current controlled by the driving thin film transistor DT. In other word, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line Vss where a low-level potential voltage is supplied. That is, the light emitting diode OLE may be driven by the high-level voltage controlled by the driving thin film transistor DT and the low-level voltage supplied from the low-level voltage line VSS.

On the substrate 110 having the thin film transistors ST and DT, a passivation layer PAS may be deposited. The passivation layer PAS may be formed of an inorganic layer such as silicon oxide or silicon nitride. A planarization layer PL may be stacked on the passivation layer PAS. The planarization layer PL is a layer for flattening the non-uniform surface of the substrate 110 on which the thin film transistor ST and DT are formed. In order to make the uneven surface condition be uniform, the planarization layer PL may be formed of an organic material. A pixel contact hole PH exposing a portion of the drain electrode DD of the driving thin film transistor DT is formed at the passivation layer PAS and the planarization layer PL.

On the upper surface of the planarization layer PL, an anode electrode ANO may be formed. The anode electrode ANO may be connected to the drain electrode DD of the driving thin film transistor DT via the pixel contact hole PH. The anode electrode ANO may have different elements according to the emission condition of the light emitting diode OLE. For the bottom emission type in which the emitted light may be provided to the substrate 110, the anode electrode ANO may be made of a transparent conductive material. For the top emission type in which the emitted light may be provided to the direction opposite to the substrate 110, the anode electrode ANO may include a metal material with excellent reflection ratio. In the present disclosure, the bottom emission type electroluminescence will be described. In the case of the bottom emission type, the anode electrode ANO may be formed of a transparent conductive material. For example, the anode electrode ANO may include an oxide conductive material such as indium-zinc-oxide (IZO) or indium-tin-oxide (ITO).

A bank BA is formed on the anode electrode ANO. For example, the bank BA may cover edge (or circumference) portions of the anode electrode ANO, and expose middle portions of the anode electrode ANO. The exposed portions of the anode electrode ANO may be defined as the emission area.

An emission layer EL may be deposited on the anode electrode ANO and the bank BA. The emission layer EL may be deposited over the whole surface of the display area DA on the substrate 110, as covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include at least any one of blue-light emission layer, green-light emission layer and red-light emission layer as corresponding to the color allocated to the pixel. In addition, the light emitting diode OLE may further include at least one functional layer for enhancing the light emitting efficiency and/or the service lifetime of the emission layer EL.

The cathode electrode CAT may be disposed on the emission layer EL. The cathode electrode CAT may be stacked on the emission layer EL as being in surface contact therewith. The cathode electrode CAT may be formed as one sheet element over the whole area of the substrate 110 with all the emission layers EL disposed at all pixels commonly connected thereto. In the case of the bottom emission type, the cathode electrode CAT may include metal material having excellent light reflection ratio. For example, the cathode electrode CAT may include at least any one of silver (Ag), aluminum (Al), molybdenum (Mo), gold (Au), magnesium (Mg), calcium (Ca) or barium (Ba).

In a bottom emission type electroluminescence display according to the present disclosure, the cathode electrode CAT may include three cathode layers. For example, the cathode electrode CAT may include a first cathode layer 100, a second cathode layer 200 and a third cathode layer 300 sequentially stacked on the emission layer EL. The first cathode layer 100 may be firstly stacked on the emission layer EL so as to be in direct surface contact with the emission layer EL. The first cathode layer 100 may made of a metal material having relatively low surface resistance. For example, the first cathode layer 100 may include any one of aluminum (Al), silver (Ag), molybdenum (Mo), gold (Au), magnesium (Mg), calcium (Ca) and barium (Ba). Considering the manufacturing process and cost, a case in which the first cathode layer 100 may be formed of aluminum will be explained.

In the case that the first cathode layer 100 is made of aluminum, the first cathode layer 100 may be formed a thickness of 100 Å to 200 Å. The metallic materials such as aluminum are opaque and relatively highly reflective. However, as aluminum is formed very thin, light may pass through the thin aluminum layer. For example, for thin aluminum layer having a thickness of 200 Å or less, a portion (40% to 50%) of incident light may be reflected by the aluminum layer, and the remainder (50% to 60%) may transmit through the aluminum layer.

The second cathode layer 200 may include conductive resin materials. The conductive resin materials may include a domain material made of a resin material with high electron mobility and a dopant for lowering the barrier energy of the domain material. The resin materials for the domain material having high electron mobility may include one of Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl) benzene'. Bphen may be an organic material that is an abbreviation of 'Bathophenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The materials for dopant may include an alkali-based doping material. For example, the materials for dopant may include at least any one of lithium (Li), cesium (Cs), cesium oxide ($Cs_2O_3$), cesium nitride ($CsN_3$), rubidium (Rb) and rubidium oxide ($Rb_2O$). In another example, the materials for dopant may include fullerene having high electron mobility. Fullerene may be a generic term for molecules in which carbon atoms are arranged in a sphere, ellipsoid or cylinder shape. For example, the materials for dopant may include Buckminster-fullerene (C60) in which 60 carbon atoms are mainly bonded in the shape of a soccer ball. In addition, the materials for dopant may include higher fullerenes such as C70, C76, C78, C82, C90, C94 and C96.

The second cathode layer 200 may have the same materials as the electron transporting layer or electron injecting layer included into the emission layer EL. However, unlike the electron transporting layer or the electron injecting layer, the second cathode layer 200 may have higher electron mobility than the electron transporting layer or the electron injecting layer. For example, the electron transporting layer or the electron injecting layer may have the electron mobility of $5.0 \times 10^{-4}$ (S/m) to $9.0 \times 10^{-1}$ (S/m), whereas the second cathode layer 200 may have an electron mobility of $1.0 \times 10^{-3}$ (S/m) to $9.0 \times 10^{+1}$ (S/m). For this, the conductive resin materials included into the second cathode layer 200 may have a dopant content higher than that of the electron transporting layer or the electron injecting layer.

For example, the electron transporting layer or the electron injecting layer has a dopant doping concentration of 2% to 10%, whereas the second cathode layer 200 may be a conductive resin material having a dopant doping concentration of 10% to 30%. The domain material itself, in which the dopant has a doping concentration of 0%, may have an electrical conductivity of $1.0 \times 10$-4 (S/m) to $5.0 \times 10^{-3}$ (S/m). By doping 10% to 30% of dopant into the domain material, the second cathode layer 200 may have improved electrical conductivity to $1.0 \times 10^{-3}$ (S/m) to $9.0 \times 10^{+1}$ (S/m) to be used as a cathode electrode.

In one case, the second cathode layer 200 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer 100 made of aluminum.

The third cathode layer 300 may be made of the same material as the first cathode layer 100. The third cathode layer 300 may have a sufficient thickness so that the sheet resistance of the cathode electrode CAT may be maintained at a constant value regardless of the position of the substrate 110 while not letting the light through but reflecting all of the light. For example, the third cathode layer 300 may be formed of a metal material having a low sheet resistance to have a relatively thicker thickness than the first and second cathode layers 100 and 200 in order to lower the overall sheet resistance of the cathode electrode CAT. For example, the third cathode layer 300 may be formed of aluminum having a thickness in range of 2,000 Å. When the thickness of the third cathode layer 300 is too thick, the manufacturing process may take a long time or the manufacturing cost may increase. Therefore, the third cathode layer 300 may be formed of aluminum having a thickness of 2,000 Å to 3,000 Å.

Figure 5A:
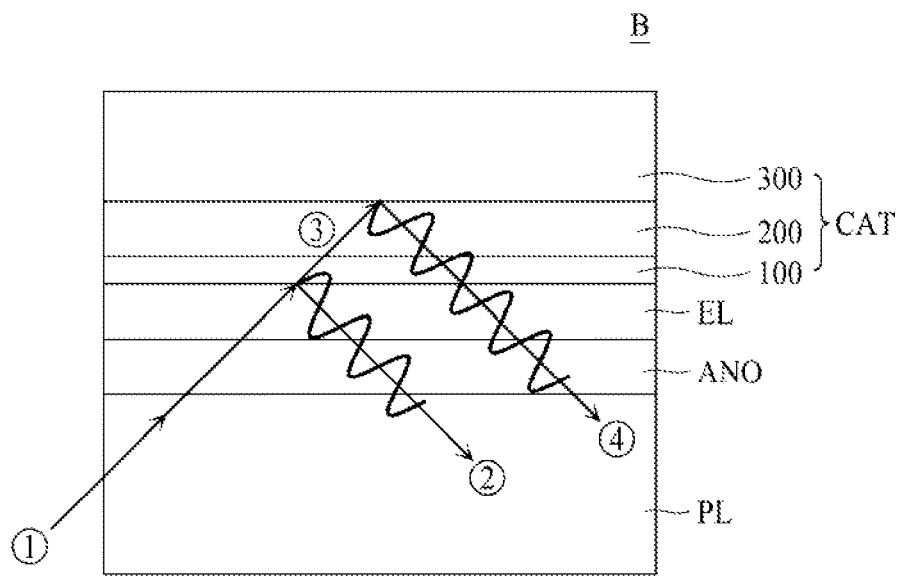
FIGS. 5A and 5B are enlarged cross-sectional views respectively illustrating the stacked structures of a pad portion and a pixel in FIG. 4.
Figure 5B:
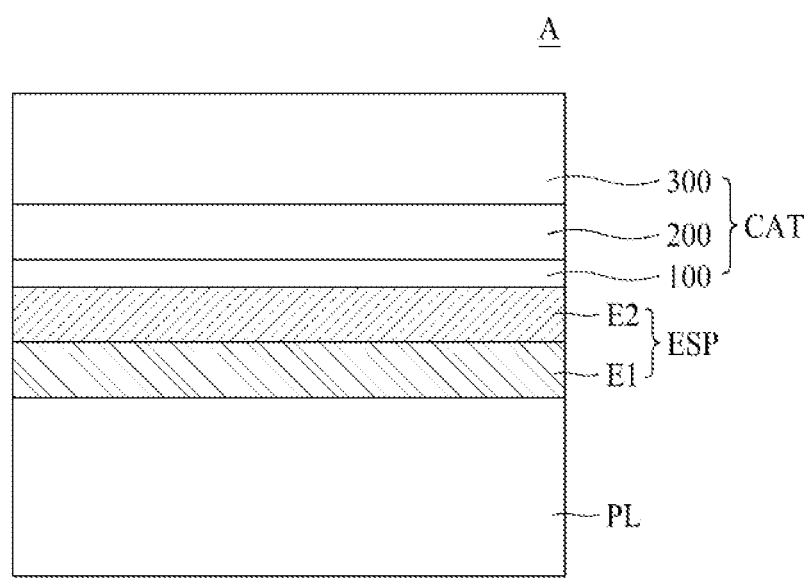

The cathode electrode CAT having such a thickness and a stacked structure mentioned above may minimize reflection ratio with respect to the light incident from the bottom direction of the substrate (i.e. from the outside to the first cathode layer 100). A portion requiring external light reflection suppression may be a display area that may mainly affect image information. Accordingly, a low reflection structure may be implemented to the cathode electrode CAT that is commonly applied over the entire display area AA. Hereinafter, description will be made with reference to arrows indicating the optical path shown in FIG. 5A. FIGS. 5A and 5B are enlarged cross-sectional views illustrating the stacked structures of a pad portion and a pixel in FIG. 4, respectively.

Referring to the structure of the cathode electrode CAT included in the pixel P, the incident light ① from the lower outside of the cathode electrode CAT may pass through the anode electrode ANO and the emission layer EL which are transparent. Some of the incident light ① may be reflected at the bottom (or lower) surface of the first cathode layer 100 and then proceed toward the substrate 110 as the first reflected light ②. Since the first cathode layer 100 has a thin thickness of 200 Å or less, all of the incident light ① may not be reflected. For example, 40% of the incident light ① may be reflected as the first reflected light ②, and the remaining 60% of the incident light ① may pass through the first cathode layer 100. The whole amount of the transmitted light ③ passing through the first cathode layer 100 may pass through the transparent second cathode layer 200. After that, the transmitted light ③ may be reflected by the third cathode layer 300. Since the third cathode layer 300 may have a thickness of 2,000 Å, at least, whole amount of the transmitted light ③ may be reflected and proceed toward the substrate 110 as the second reflected light ④.

Here, by adjusting or changing the thickness of the second cathode layer 200, the phases of the first reflected light ② and the second reflected light ④ may be set to cancel each other. For example, considering the conductivity and the phase cancellation condition, the thickness of the second cathode layer 200 may be in range of 500 Å to 900 Å. Accordingly, the reflected light luminance, which is the intensity of the reflected light incident from outside of the cathode electrode CAT and finally reflected to the outside of the substrate 110 may be reduced to 2% or less.

Meanwhile, among the lights emitted from the emission layer EL, the amount of lights emitted to the direction of the cathode electrode CAT and reflected by the cathode electrode CAT may be reduced by about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

The electroluminescence display according to the first aspect may be the bottom emission type including cathode electrode CAT of a triple layer stacked structure. The reflection ratio of the external light may be suppressed as much as possible by the structure of the cathode electrode CAT of the triple layer stacked structure. Therefore, there is no need to dispose a polarization element on the outside of the substrate 110 to reduce the external light reflection. The polarization element has a positive effect of suppressing the external light reflection, but has a negative effect of reducing the amount of light emitted from the emission layer EL by at least 50%.

In the electroluminescence display according to the first aspect, the amount of the light emitted from the emission layer EL may be reduced by about 50% due to the cathode electrode CAT of the triple layer stack structure, but this is almost the same as the reduction in the amount of light due to the polarization element. Accordingly, the electroluminescence display according to the present disclosure may minimize the external light reflection while providing the same level of luminous efficiency of the emission layer EL without using an expensive polarization element.

Referring to FIG. 5B for the structure of the cathode electrode CAT at the pad portion 310, the cathode electrode CAT is connected to the low potential pad ESP disposed at the pad portion 310. For example, the low potential pad ESP may be formed on the planarization layer PL having the same plane as the anode electrode ANO. In the case of the bottom emission type, the anode electrode ANO includes a transparent conductive material. The transparent conductive material may have a higher surface resistance and contact resistance than a metal material, which may be disadvantageous in uniformly supplying a low potential voltage.

In order to prevent this problem, in the electroluminescence display according to the present disclosure, the low potential pad ESP may have a structure in which a first electrode layer E1 including the same material as the anode electrode ANO and a second electrode layer E2 including a metal material having low resistance are sequentially stacked. For example, the first electrode layer E1 may include indium-tin-oxide or indium-zinc-oxide. The second electrode layer E2 may be formed of aluminum (Al), copper (Cu), molybdenum (Mo), chromium (Cr), titanium (Ti), tantalum (Ta) or an alloy thereof. Here, the second electrode layer E2 may be disposed only on the pad portion 310 and may be not disposed on the display area AA.

The low potential pad portion disposed in the non-display area NDA may include a low potential pad ESP disposed on the planarization layer PL, a bank BA, a cathode contact hole CHC and a cathode electrode CAT. The low potential pad ESP may include a first electrode layer E1 and a second electrode layer E2 sequentially stacked on the planarization layer PL. The bank BA may cover the edge (or circumference) areas of the low potential pad ESP. Therefore, the cathode contact hole CHC, which is formed at the bank BA, may exposes most of middle portion of the low potential pad ESP. The cathode electrode CAT may extend from the display area AA to cover the bank BA, and may be in surface contact with the low potential pad ESP.

In more detail, the second electrode layer E2 including a metal material stacked on the low potential pad ESP and the first cathode layer 100 of the cathode electrode CAT are in direct surface contact. Further, the second cathode layer 200 may be stacked on the first cathode layer 100, and a third cathode layer 300 may be stacked on the second cathode layer 200.

The current density applied from the pad portion 310 to the low potential pad ESP for supplying the low potential voltage to the cathode electrode CAT may be 800 to 2,000 times greater than the current density of the entire cathode electrode CAT applied to the entire display area AA. Therefore, it is important to keep the contact resistance of the pad portion 310 as low as possible. However, since the first cathode layer 100 has a very thin thickness of 200 Å or less, it is difficult to lower the contact resistance between the cathode electrode CAT and the low potential pad ESP.

Hereinafter, in the second aspect, a connection structure for further lowering the contact resistance between the cathode electrode CAT and the low potential pad ESP in the electroluminescence display according to the first aspect of the present disclosure will be proposed.

Second Aspect

Figure 6:
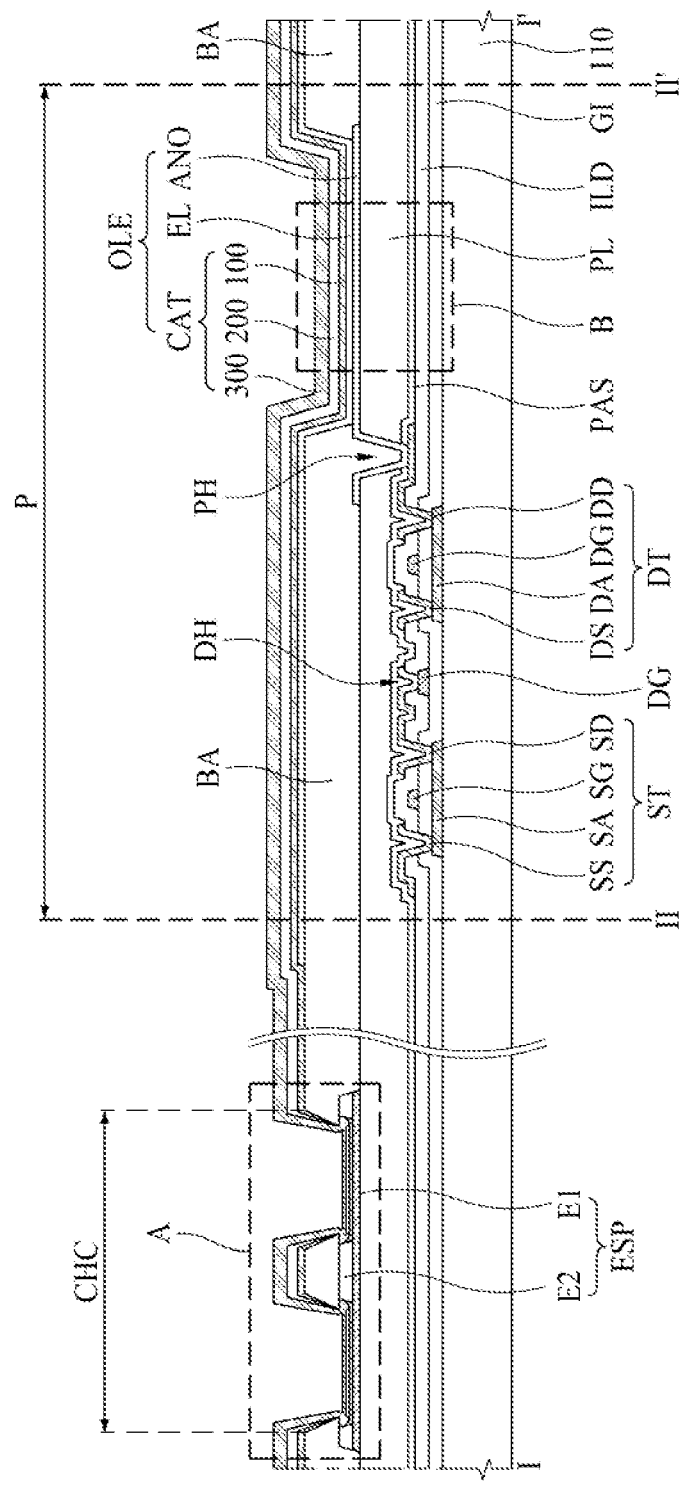
FIG. 6 is a cross-sectional view along cutting line I-I' in FIG. 1 and cutting line II-II' in FIG. 3, for illustrating a structure of the electroluminescence display according to another aspect of the present disclosure.
Figure 7:
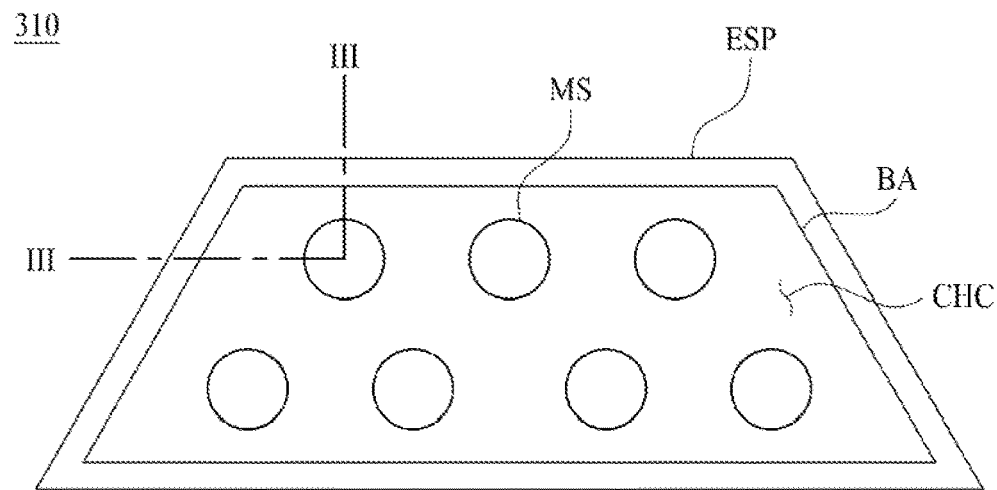
FIG. 7 is an enlarged cross-sectional view illustrating a stack structure of the pad portion shown in FIG. 6.
Figure 8:
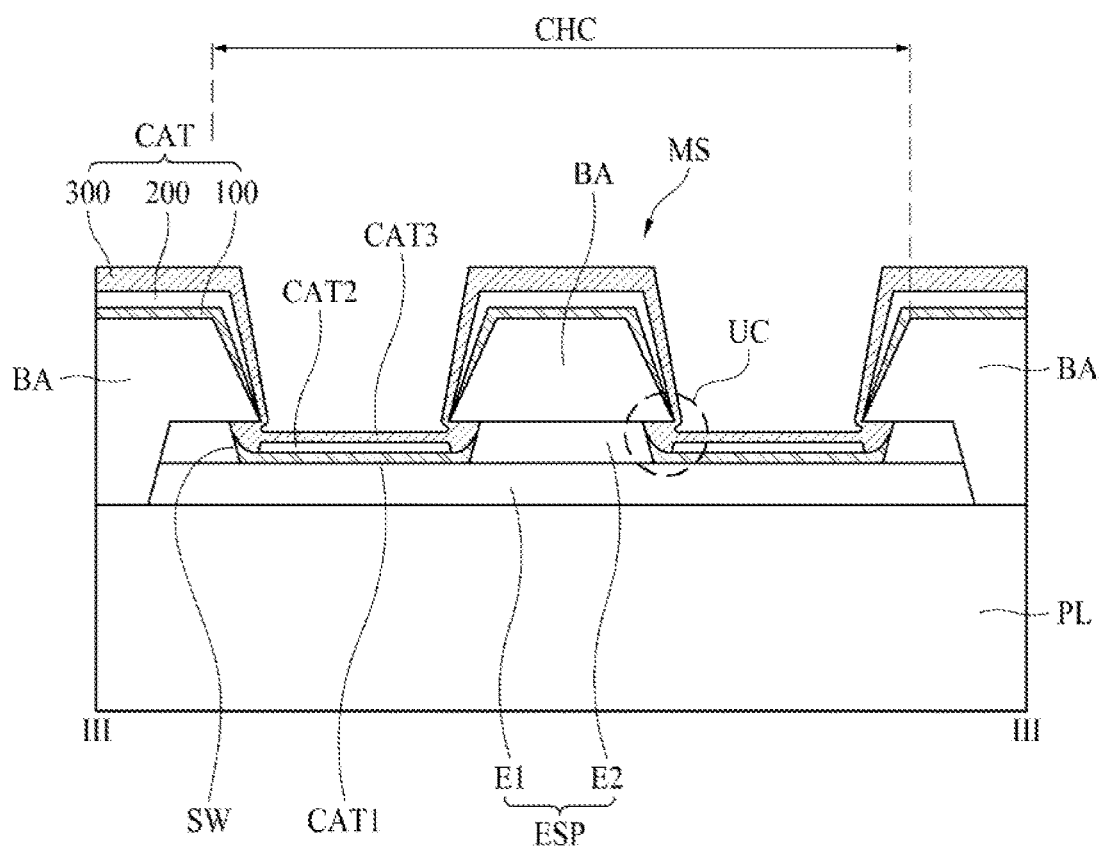
FIG. 8 is an enlarged plane view illustrating an arrangement of mushroom structures disposed at the pad portion shown in FIG. 6.

Referring to FIGS. 6 to 8, a second aspect of the present disclosure will be described. FIG. 6 is a cross-sectional view along the cutting line I-I' in FIG. 1 and the cutting line II-II' in FIG. 3, for illustrating the structure of the electroluminescence display according to the second aspect of the present disclosure. FIG. 7 is an enlarged cross-sectional view illustrating a stack structure of the pad portion shown in FIG. 6. FIG. 8 is an enlarged plane view illustrating the arrangement of the mushroom structures disposed at the pad portion shown in FIG. 6. Since the structure of the display area AA in the second aspect may be the same as that of the first aspect, the structure of the display area illustrated in FIG. 6 may be the same as that of the display area AA illustrated in FIG. 5, and a redundant description thereof will not be duplicated.

Referring to FIGS. 6 and 7, for illustrating the electroluminescence display according to the second aspect, the pad portion 310 may include a low potential pad ESP formed on the planarization layer PL, a bank BA, a mushroom structure element MS, a cathode contact hole CHC and a cathode electrode CAT. The low potential pad ESP may include a first electrode layer E1 and a second electrode layer E2 sequentially stacked on the planarization layer PL. The bank BA may cover the edge (or circumference) areas of the low potential pad ESP. The mushroom structure element MS is formed by that the bank BA has wider width than the width of the patterned second electrode layer E2 under the bank BA. The mushroom shape may be formed due to the over-etching and under-cut of the second electrode layer E2.

Therefore, the cathode contact hole CHC, which is formed at the bank BA, may exposes most of middle portion of the low potential pad ESP. The mushroom structure element MS may be formed on the surface of the low potential pad ESP exposed by the cathode contact hole CHC. At least one mushroom structure element may be arranged. The cathode electrode CAT may extend from the display area AA to cover the bank BA, and may be in surface contact with the cathode contact hole CHC and the upper surface of the low potential pad ESP exposed by the mushroom structure element MS. Here, the term of 'mushroom structure element' is used to refer to a structure element having a mushroom shape with a wide upper portion and a narrow lower portion.

Referring to FIGS. 7 and 8, the detailed structure of the low potential pad ESP will be explained. The edge portions of the low potential pad ESP may be covered by the bank BA, and the middle portions of the low potential pad ESP may be exposed by the mushroom structure element MS. The mushroom structure element MS may be formed of the same material as the bank BA. The second electrode layer E2 including a metal material which is the upper layer of the low potential pad ESP may be disposed below the mushroom structure element MS and bank BA. The second electrode layer E2 may be not disposed in the display area AA.

By etching the exposed second electrode layer E2 by the mushroom structure element MS and the bank BA, the first electrode layer E1 may be exposed. In this etching process, the second electrode layer E2 may be over etched to form a under-cut area UC at the lower edges of the mushroom structure element MS and the bank BA. The under-cut area UC refers to an area formed in a shape in which the lower layer is indented from the lower part of the upper layer as a result of the lower layer being etched more than the upper layer using an etchant having a low etching rate for the upper layer and a high etching rate for the lower layer. Since the second electrode layer E2 is not present in the display area AA, the anode electrode ANO includes only a transparent conductive material. Accordingly, the under-cut area is not formed under the bank BA covering the edge of the anode electrode ANO in the display area AA.

After the mushroom structure element MS and the bank BA are formed and the under-cut area UC is formed, the emission layer EL is deposited in the display area AA. In this case, the emission layer EL may be applied using an open mask that covers the non-display area NDA and exposes the entire display area AA.

Thereafter, the cathode electrode CAT is deposited to cover all of the entire area of the display area AA and the non-display area NDA. As a result, in the display area AA, the organic light emitting diode OLE in which the anode electrode ANO, the emission layer EL and the cathode electrode CAT are stacked for each pixel P area is completed.

At the same time, the cathode electrode CAT may be also stacked on the pad portion 310 disposed in the non-display area NDA. Considering the manufacturing process for the cathode electrode CAT, the first cathode layer 100 is firstly deposited. The first cathode layer 100 made of aluminum may be deposited on the under-cut area UC formed in the mushroom structure element MS in the pad portion 310. In particular, the first cathode layer 100 is stacked while in contact with the etched side SW of the second electrode layer E2 exposed in the under-cut area UC, and in contact with the exposed surface of the first electrode layer E1.

Next, the second cathode layer 200 is deposited. Since the second cathode layer 200 is formed of a conductive resin material, it is deposited only on portions of the upper surface of the first cathode layer 100 exposed to the bank BA and the mushroom structure element MS. That is, the second cathode layer 200 is not deposited on the under-cut area UA.

Finally, the third cathode layer 300 is deposited. Since the third cathode layer 300 is made of aluminum, it is also deposited on the under-cut area UC formed in the mushroom structure element MS in the pad portion 310. As a result, the first cathode layer 100 and the third cathode layer 300 may directly contact each other in the under-cut area UC of the mushroom structure element MS. Accordingly, the contact resistance between the cathode electrode CAT and the low potential pad ESP may be stably maintained at a low value by the mushroom structure element MS. In order to ensure more low resistance connection structure by the mushroom structure element MS, a plurality of mushroom structure elements MS may be arrayed on the surface of the low potential pad ESP exposed by the cathode contact hole CHC, as shown in FIG. 7.

The features, structures, effects and so on described in the above example aspects of the present disclosure are included in at least one example aspect of the present disclosure, and are not necessarily limited to only one example aspect. Furthermore, the features, structures, effects and the like explained in at least one example aspect may be implemented in combination or modification with respect to other example aspects by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that aspects of the present disclosure cover the various substitutions, modifications, and variations of the present disclosure, provided they come within the scope of the appended claims and their equivalents. These and other changes can be made to the aspects in light of the above detailed description. In general, in the following claims, the terms used should not be construed to limit the claims to the specific example aspects disclosed in the specification and the claims, but should be construed to include all possible aspects along with the full scope of equivalents to which such claims are entitled. Accordingly, the claims are not limited by the disclosure.

What is claimed is:

1. An electroluminescence display comprising:
a substrate including a display area and a non-display area, the non-display area disposed around the display area;
a low potential pad disposed at the non-display area and including a first electrode layer and a second electrode layer disposed on the first electrode layer;
a bank including a cathode contact hole exposing a middle portion of the low potential pad, and covering edge portions of the low potential pad;
a mushroom structure element disposed at the middle portion of the low potential pad;
an under-cut area formed at under edges of the bank and the mushroom structure element;
a first cathode layer disposed on an upper surface of the bank and the mushroom structure element, and an upper surface of the low potential pad exposed by the cathode contact hole and in the under-cut area;
a second cathode layer disposed on the first cathode layer excepting the under-cut area; and
a third cathode layer contacting an upper surface of the second cathode layer and the first cathode layer at the under-cut area,
wherein the mushroom structure element covers an upper surface of the second electrode layer of the low potential pad, and exposes an upper surface of the first electrode layer of the low potential pad,
wherein the under-cut area exposes a sidewall of the second electrode layer of the low potential pad and an upper surface of the first electrode layer of the low potential pad, and
wherein the third cathode layer directly contacts the sidewall of the second electrode layer, at the under-cut area.

2. The electroluminescence display according to claim 1, wherein the first electrode layer includes a transparent conductive material, and wherein the second electrode layer includes a metal material.

3. The electroluminescence display according to claim 2, wherein the transparent conductive material includes one of indium-tin-oxide and indium-zinc-oxide, and
wherein the metal material includes one of aluminum (Al), copper (Cu), molybdenum (Mo), chromium (Cr), titanium (Ti) and tantalum (Ta).

4. The electroluminescence display according to claim 1, wherein the first cathode layer has a first thickness in range of 100 Å to 200 Å,
wherein the second cathode layer has a second thickness in range of 500 Å to 900 Å, and
wherein the third cathode layer has a third thickness in range of 2,000 Å to 3,000 Å.

5. The electroluminescence display according to claim 1, wherein the first cathode layer directly contacts a side wall of the second electrode layer over-etched at the under-cut area, and
wherein the third cathode layer directly contacts the first cathode layer and the side wall of the over-etched second electrode layer, at the under-cut area.

6. The electroluminescence display according to claim 1, wherein the mushroom structure element is arrayed on the low potential pad exposed to the cathode contact hole.

7. The electroluminescence display according to claim 1, further comprising a pixel disposed in the display area,
wherein the pixel includes:
an anode electrode disposed on the substrate;
the bank covering edges of the anode electrode and exposing middle portion of the anode electrode;
an emission layer disposed on the bank and the anode electrode exposed to the bank; and
a cathode electrode having the first cathode layer on the emission layer, the second cathode layer on the first cathode layer and the third cathode layer on the second cathode layer.

8. The electroluminescence display according to claim 1, wherein the first cathode layer and the third cathode layer include a metal material.

9. The electroluminescence display according to claim 8, wherein the metal material having low surface resistance includes one of aluminum (Al), silver (Ag), molybdenum (Mo), magnesium (Mg), calcium (Ca) and barium (Ba), and
wherein the second cathode layer includes a conductive resin material.

10. The electroluminescence display according to claim 9, wherein the conductive resin material includes:
a domain material including one of Alq3, TmPyPB, Bphen, TAZ and TPB; and
a dopant including one of an alkali metal material and fullerene disposed in the domain material.

11. The electroluminescence display according to claim 10, wherein the alkali metal material includes one of Li, Cs, $Cs_2O_3$, $CsN_3$, Rb and $Rb_2O$, and
wherein the fullerene includes one of C60, C70, C76, C78, C82, C90, C94 and C96.

12. An electroluminescence display comprising:
a substrate including a display area and a non-display area, the non-display area disposed around the display area;
a low potential pad disposed at the non-display area and including a first electrode layer and a second electrode layer disposed on the first electrode layer;
a bank including a cathode contact hole exposing a portion of the low potential pad, and a bank covers edge portions of the low potential pad;
a mushroom structure element disposed in the cathode contact hole, and including an under-cut area;
a first cathode layer disposed on an upper surface of the bank and the mushroom structure element, and an upper surface of the low potential pad;
a second cathode layer disposed on the first cathode layer, and overlapping with the mushroom structure element; and
a third cathode layer disposed on an upper surface of the second cathode layer,
wherein the under-cut area disposed at under edge of the mushroom structure element,
wherein the second cathode layer is disconnected at the under-cut area, and
wherein the third cathode layer directly contacts the first cathode layer at the under-cut area.

13. The electroluminescence display according to claim 12, wherein the second cathode layer is disposed between the first cathode layer and the third cathode layer, and the second cathode layer is disposed between the bank and the mushroom structure element.

14. The electroluminescence display according to claim 12, wherein, at the under-cut area, a side surface of the second electrode layer is in directly contact with the third cathode layer.

* * * * *